US007529149B2

(12) United States Patent
Pyeon et al.

(10) Patent No.: US 7,529,149 B2
(45) Date of Patent: May 5, 2009

(54) MEMORY SYSTEM AND METHOD WITH SERIAL AND PARALLEL MODES

(75) Inventors: Hong Beom Pyeon, Kanata (CA); HakJune Oh, Kanata (CA); Jin-Ki Kim, Kanata (CA)

(73) Assignee: MOSAID Technologies Incorporated, Kanata, Ontario (CA)

( * ) Notice: Subject to any disclaimer, the term of this patent is extended or adjusted under 35 U.S.C. 154(b) by 190 days.

(21) Appl. No.: 11/637,175

(22) Filed: Dec. 12, 2006

(65) Prior Publication Data

US 2008/0137461 A1 Jun. 12, 2008

(51) Int. Cl.
*G11C 8/00* (2006.01)

(52) U.S. Cl. ........................... 365/230.03; 365/230.02; 365/189.02; 365/185.11

(58) Field of Classification Search ............ 365/230.03, 365/230.02, 189.02, 185.11
See application file for complete search history.

(56) References Cited

U.S. PATENT DOCUMENTS 4,174,536 A 11/1979 Misunas et al.
4,733,376 A 3/1988 Ogawa
4,796,231 A 1/1989 Pinkham
5,126,808 A 6/1992 Montalvo et al.
5,136,292 A 8/1992 Ishida
5,175,819 A 12/1992 Le Ngoc et al.
5,243,703 A 9/1993 Farmwald et al.
5,280,539 A 1/1994 Yeom et al.
5,365,484 A 11/1994 Cleveland et al.
5,404,460 A 4/1995 Thomsen et al.
5,440,694 A 8/1995 Nakajima
5,452,259 A 9/1995 McLaury
5,473,563 A 12/1995 Suh et al.
5,473,566 A 12/1995 Rao
5,473,577 A 12/1995 Miyake et al.
5,596,724 A 1/1997 Mullins et al.
5,602,780 A 2/1997 Diem et al.
5,636,342 A 6/1997 Jeffries
5,671,178 A 9/1997 Park et al.
5,721,840 A 2/1998 Soga
5,740,379 A 4/1998 Hartwig (Continued)

FOREIGN PATENT DOCUMENTS

CA 2310080 5/1999

(Continued)

OTHER PUBLICATIONS

Samsung Electronics Co. Ltd, "256M × 8 Bit / 128 M × 16 Bit / 512M × 8 Bit NAND Flash Memory", K9K4G08U1M, May 6, 2005, pp. 1-41.

(Continued)

*Primary Examiner*—Son Dinh
*Assistant Examiner*—Nam Nguyen

(57) ABSTRACT

Methods and systems are provided that allow the method of access to one or more memory banks to be performed using serial access, or using parallel access. In serial mode, each link operates as an independent serial link. In contrast, during serial mode, the links operate in common as a parallel link. Where input and output controls are received independently for each link for serial mode, a single set of input and output controls is used in common by all of the links during parallel mode.

19 Claims, 11 Drawing Sheets

U.S. PATENT DOCUMENTS 5,761,146 A 6/1998 Yoo et al.
5,771,199 A 6/1998 Lee
5,802,006 A 9/1998 Ohta
5,802,399 A 9/1998 Yumoto et al.
5,818,785 A 10/1998 Ohshima
5,828,899 A 10/1998 Richard et al.
5,835,935 A 11/1998 Estakhri et al.
5,859,809 A 1/1999 Kim
5,862,154 A 1/1999 Pawlowski
5,872,994 A 2/1999 Akiyama et al.
5,937,425 A 8/1999 Ban
5,941,941 A 8/1999 Hasegawa
5,941,974 A 8/1999 Babin
5,959,930 A 9/1999 Sakurai
5,982,309 A 11/1999 Xi et al.
5,995,417 A 11/1999 Chen et al.
6,002,638 A 12/1999 John
6,085,290 A 7/2000 Smith et al.
6,091,660 A 7/2000 Sasaki et al.
6,107,658 A 8/2000 Itoh et al.
6,144,576 A 11/2000 Leddige et al.
6,148,364 A 11/2000 Srinivasan et al.
6,178,135 B1 1/2001 Kang
6,212,591 B1 4/2001 Kaplinsky
6,304,921 B1 10/2001 Rooke
6,317,350 B1 11/2001 Pereira et al.
6,317,352 B1 11/2001 Halbert et al.
6,356,487 B1 * 3/2002 Merritt .................. 365/189.05
6,438,064 B2 8/2002 Ooishi
6,442,098 B1 8/2002 Kengeri
6,462,986 B1 * 10/2002 Khan ...................... 365/185.2
6,535,948 B1 3/2003 Wheeler et al.
6,584,303 B1 6/2003 Kingswood et al.
6,594,183 B1 7/2003 Lofgren et al.
6,601,199 B1 7/2003 Fukuda et al.
6,611,466 B2 8/2003 Lee et al.
6,658,582 B1 12/2003 Han
6,680,904 B1 1/2004 Kaplan et al.
6,715,044 B2 3/2004 Lofgren et al.
6,732,221 B2 5/2004 Ban
6,754,807 B1 6/2004 Parthasarathy et al.
6,763,426 B1 7/2004 James et al.
6,766,411 B2 7/2004 Goldshlag
6,768,431 B2 7/2004 Chiang
6,792,003 B1 9/2004 Potluri et al.
6,807,103 B2 10/2004 Cavaleri et al.
6,816,933 B1 11/2004 Andreas
6,850,443 B2 2/2005 Lofgren et al.
6,853,557 B1 2/2005 Haba et al.
6,853,573 B2 2/2005 Kim et al.
6,919,736 B1 7/2005 Agrawal et al.
6,928,501 B2 8/2005 Andreas et al.
6,944,697 B2 9/2005 Andreas
6,950,325 B1 9/2005 Chen
6,967,874 B2 11/2005 Hosono
7,073,022 B2 7/2006 El-Batal et al.
2002/0188781 A1 12/2002 Schoch et al.
2004/0001380 A1 1/2004 Becca et al.
2004/0019736 A1 1/2004 Kim et al.
2004/0024960 A1 2/2004 King et al.
2004/0039854 A1 2/2004 Estakhri et al.
2004/0186956 A1 9/2004 Perego et al.
2004/0199721 A1 10/2004 Chen
2004/0230738 A1 11/2004 Lim et al.
2005/0160218 A1 7/2005 See et al.
2005/0213421 A1 9/2005 Polizzi et al.
2006/0050594 A1 3/2006 Park

FOREIGN PATENT DOCUMENTS

WO WO 01/69411 A2 9/2001

OTHER PUBLICATIONS

Toshiba, "2GBIT (256M × 8 Bits) CMOS NAND E2PROM", TH58NVG1S3AFT05, May 19, 2003, pp. 1-32.
Amtel Corp., "High Speed Small Sectored SPI Flash Memory", pp. 1-22, 2006.
64 Megabit CMOS 3.0 Volt Flash Memory with 50MHz SPI.
King, et al., "Communicating with Daisy Chained MCP42XXX Digital Potentiometers", Microchip AN747, pp. 1-8, 2001.
Intel Corporation, "Intel® Advanced+ Boot Block Flash Memory (C3)", May 2005, pp. 1-72.
M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.
Tal, A., "Guidelines for Integrating DiskOnChip in a Host System", AP-DOC-1004, Rev. 1.0, M-Systems Flash Pioneers Ltd., pp. 1-15, 2004.
Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.
Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.
Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.
"HyperTransport TM I/O Link Specification", Revision 2.00, Document No. HTC20031217-0036-00, Hypertransport Technology Consortium, pp. 1-325, 2001.
"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).
Oshima, et al., "High-Speed Memory Architectures for Multimedia Applications", Circuits & Devices, IEEE 8755-3996/97, pp. 8-13, Jan. 1997.
Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.
Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.
Gjessing, S., et al., "A RAM Link for High Speed", Special Report/Memory, IEEE Spectrum, pp. 52-53, Oct. 1992.
Diamond, S.L., "SyncLink: High: High-speed DRAM for the Future", Micro Standards, IEEE Micro, pp. 74-75, Dec. 1996.
Samsung Electronics, "DDR2 Fully Buffered DIMM 240pin FBDIMMS based on 512Mb C-die" Rev. 1.3, Sep. 2006, pp. 1-32, Sep. 2006.
"HyperTransport TM I/O Link Specification", Revision 3.00, Document No. HTC20051222-0046-0008, Hypertransport Technology Consortium, pp. 1-428, Apr. 2006.

* cited by examiner

MEMORY SYSTEM AND METHOD WITH SERIAL AND PARALLEL MODES

FIELD OF THE INVENTION

The present invention relates to parallel memory systems and serial memory systems.

BACKGROUND OF THE INVENTION

Current consumer electronic devices use memory devices. For example, mobile electronic devices such as digital cameras, portable digital assistants, portable audio/video players and mobile terminals continue to require mass storage memories, preferably non-volatile memory with ever increasing capacities and speed capabilities. Non-volatile memory and hard-disk drives are preferred since data is retained in the absence of power, thus extending battery life.

While existing memory devices operate at speeds sufficient for many current consumer electronic devices, such memory devices may not be adequate for use in future electronic devices and other devices where high data rates are desired. For example, a mobile multimedia device that records high definition moving pictures is likely to require a memory module with a greater programming throughput than one with current memory technology. While such a solution appears to be straightforward, there is a problem with signal quality at such high frequencies, which sets a practical limitation on the operating frequency of the memory. The memory communicates with other components using a set of parallel input/output (I/O) pins, the number of which is implementation specific. The I/O pins receive command instructions and input data and provide output data. This is commonly known as a parallel interface. High speed operation may cause communication degrading effects such as cross-talk, signal skew and signal attenuation, for example, which degrades signal quality.

In order to incorporate higher density and faster operation on system boards, there are two design techniques: serial interconnection configurations such as daisy chain and parallel interconnection configurations such as multi-drops. These design techniques may be used to overcome the density issue that determines the cost and operating efficiency of memory swapping between a hard disk and a memory system. However, multi-drop configurations have a shortcoming relative to the daisy chain configurations. For example, if the number of drops in a multi-drop memory system increases, then as a result of loading effect of each pin, delay time also increases so that the total performance of the multi-drop memory system is degraded. This is due to the wire resistor-capacitor loading and the pin capacitance of the memory device. A serial link in a device such as a memory device may utilize a single pin input that receives all address, command, and data serially. The serial link may provide a serial daisy chain configuration to control command bits, address bits, and data bits effectively through the cascading configuration. By providing a serial daisy chain configuration, a memory device identifier (ID) number is assigned to each device on a cascaded chain. Memory devices may be dynamic random access memories (DRAMs), static random access memories (SRAMs) and Flash memories.

SUMMARY OF THE INVENTION

Methods and systems are provided that allow the method of access to one or more memory banks to be performed using serial access, or using parallel access. In serial mode, each link operates as an independent serial link. In contrast, during parallel mode, the links operate in common as a parallel link. Where input and output controls are received independently for each link for serial mode, a single set of input and output controls is used in common by all of the links during parallel mode.

According to one broad aspect, the invention provides a memory system comprising: at least one memory bank; dual-mode interface circuitry connecting a plurality of inputs and a plurality of outputs to the at least one memory bank, the interface circuitry having a serial mode during which each of at least one input operates as a respective serial input and each of at least one output operates as a respective serial output, the interface circuitry having a parallel mode during which the inputs operate collectively as a parallel input and the outputs operate collectively as a parallel output.

In some embodiments, the at least one memory bank comprises a plurality of memory banks.

In some embodiments, during serial mode, the at least one input that each operates as a respective serial input comprises a plurality of the inputs, and the at least one output that operates as a respective serial output comprises a plurality of the outputs.

In some embodiments, the dual-mode interface circuitry comprises: a plurality of link and bank controllers each having a respective input of the plurality of inputs; wherein each of the plurality of link and bank controllers is operable in serial mode to perform read and write operations in a serial manner by processing for each read and write operation a single bitwidth input signal received on the respective input containing command, address and data if the operation is write operation; wherein the plurality of link and bank controllers are operable collectively in parallel mode to perform read and write operations in parallel by processing for each read and write operation a multiple bitwidth input signal received on multiple inputs containing command, address and data if the operation is a write operation.

In some embodiments, each link and bank controller is connected to a predetermined one of the memory banks and each memory bank is connected to a predetermined one of the outputs.

In some embodiments, each link and bank controller further comprises a respective input control for write operations and a respective output control for read operations; the dual mode interface circuitry is operable during parallel mode to connect the input control of a common one of the plurality of link and bank control circuits to the input control of the remaining link and bank control circuits and to connect the output control of the common of the plurality of link and bank control circuits to the output control of the remaining link and bank circuits such that during parallel mode all of the link and bank control circuits operate in common; the dual mode interface circuitry is operable during the serial mode to allow independent signals to be received at each input control and output control.

In some embodiments, the plurality of link and bank controllers comprise a respective link and bank controller for each memory bank.

In some embodiments, the memory system further comprises: at least one link switch that operates during serial mode to connect each link and bank controller to a respective selected bank, and that operates during parallel mode to connect all of the link and bank controllers to a selected memory bank.

In some embodiments, the at least one link switch comprises a first link switch that connects each link to a respective selected bank for write and control, and a second link switch that connects each link to the selected bank for read, preventing simultaneous connection of multiple links to the same bank.

In some embodiments, the dual mode interface circuitry comprises: an input 66 for receiving a data width control input that selects between serial mode and parallel mode.

In some embodiments, the dual mode interface circuit comprises: an input for receiving a data width control input signal that selects between serial mode and parallel mode; for each link and bank controller, a respective first multiplexer having first and second inputs, each first input connected to the respective input control of the link and bank controller, each second input connected to the input control of a common one of the link and bank controllers, the first multiplexer operable to select the first input or the second input under control of the data control width control input; for each link and bank controller, a respective second multiplexer having first and second inputs, each first input connected to the respective output control of the link and bank controller, each second input connected to the output control of the common one of the link and bank controllers, the second multiplexer operable to select the first input or the second input under control of the data control width control input signal.

In some embodiments, the dual mode interface circuitry comprises: for each memory bank, a respective parallel to serial converter having a serial output; switching logic that switches the serial output of each parallel to serial converter towards a selected output.

In some embodiments, the memory system further comprises: selector logic for selecting serial outputs of the parallel to serial converters during serial mode, and for selecting a parallel output during parallel mode.

In some embodiments, the memory system further comprises: a data width converter that produces said parallel output by converting an output from a selected bank from a data width for bank access to a data width equal to the number of outputs of said plurality outputs.

In some embodiments, the dual mode interface circuitry comprises: for each memory bank, a respective serial to parallel to converter; switching logic that switches each input to the input a respective selected one of the serial to parallel converters.

In some embodiments, the memory system further comprises: a data width converter that converts a parallel input having a data width equal to the number of inputs of said plurality of inputs to a data width for bank access.

According to another broad aspect, the invention provides a method comprising: reconfiguring a memory interface into a selected one of a serial mode and a parallel mode according to a data width control input; in serial mode, the memory interface functioning as at least one serial interface; in parallel mode, the memory interface functioning as a parallel interface.

In some embodiments, the method further comprises: during serial mode, providing serial access from each link to any bank of a plurality of banks.

In some embodiments, reconfiguring a memory interface into a selected one of a serial mode and a parallel mode according to a data width control input comprises: for serial mode, reconfiguring a plurality of link and bank controllers such that during serial mode, independent input and output controls are received for each of at the at least one serial interface; for parallel mode, reconfiguring the plurality of link and bank controllers such that an input and output control received at one link and bank controller is used in common by all of the link and bank controllers.

BRIEF DESCRIPTION OF THE DRAWINGS

Embodiments of the present invention will now be described, by way of example only, with reference to the attached Figures, wherein.

DETAILED DESCRIPTION

High bandwidth capabilities for many operations involving memory devices is becoming an increasingly important issue in digital systems. Diverse approaches are being attempted to achieve the goal of high performance. One representative method being used in an effort of attaining this goal is to use a serial interface with single bit data width over which all information including command, address, and read and write data is transferred serially to the next destination. Many existing products in the consumer electronics market make use of such a serial interface.

Serial data transfer approaches have many advantages over parallel data transfer approaches. For example, the interconnections used for serial data transfer do not have the crosstalk and interference among the data lines on a printed circuit board that are typically found in parallel interconnections.

Figure 1:
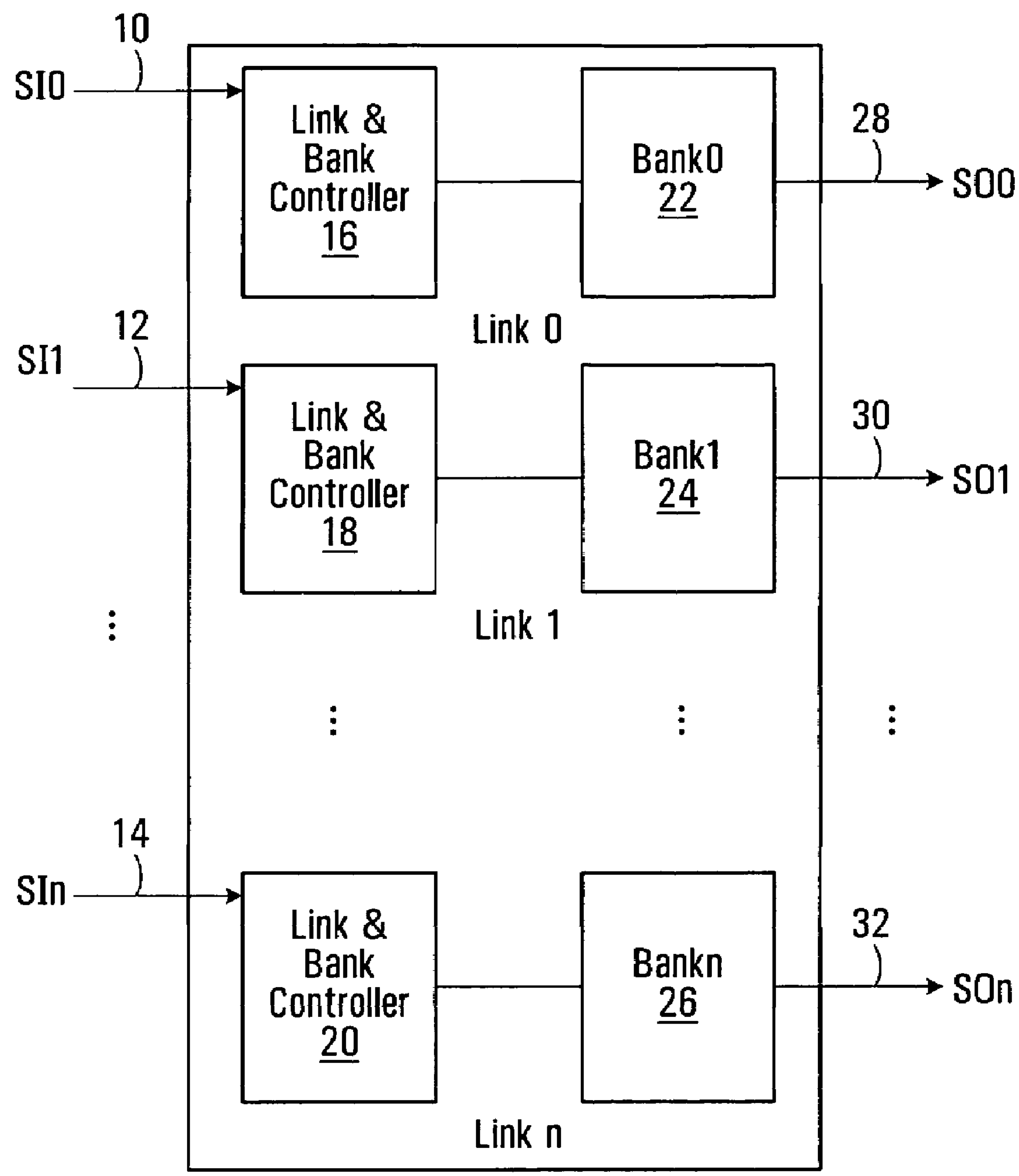
FIG. 1 is a block diagram of a memory system featuring multiple links and multiple banks with serial interfaces.

In order to increase the maximum peak performance of memory devices with serial data transfer, multiple-link modes are being considered that make use of serial interfaces. Specifically, each of a set of links operates like a separate serial link with its own command, address, and read and write data. FIG. 1 shows an example of a memory system featuring multiple serial interfaces. In the FIG. 1 example, shown are a set of serial inputs SI1 10, SI2 12, SIn 14 connected to respective link and band controllers 16,18,20. Each of the link and bank controllers 16,18,20 are connected to respective memory banks bank0 22, bank1 24, bankn 26. The serial outputs are indicated at SO0 28, SO1 30, . . . , SOn 32. FIG. 1 shows a dedicated link to each bank. All data transfer is done by the serial data process. Multiple circuits such as shown in FIG. 1 may be connected in sequence with addressing on the serial interconnections used to select a particular one of the multiple circuits.

Figure 2:
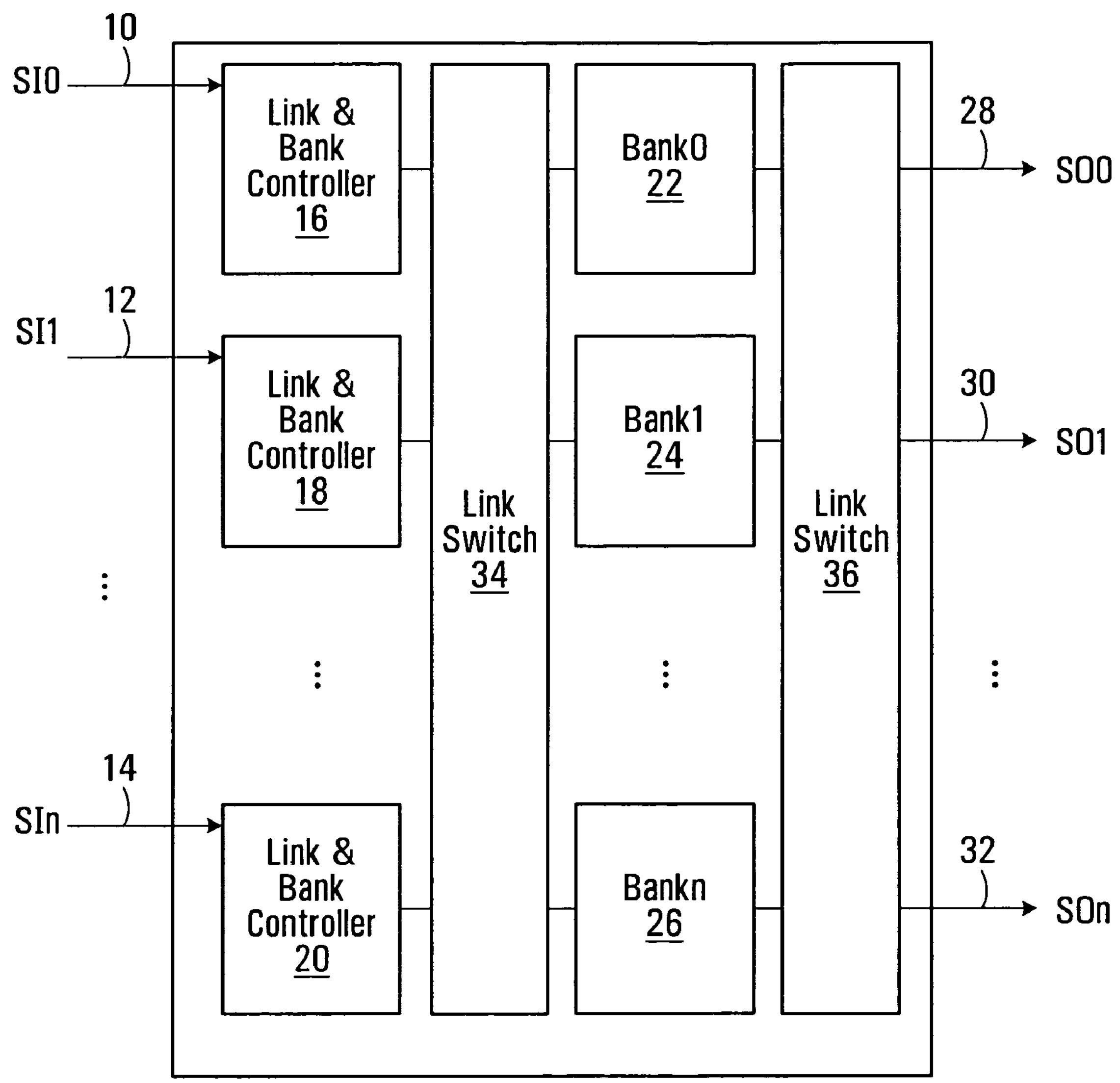
FIG. 2 is a block diagram of a memory system featuring multiple independent links and multiple banks with serial interfaces.

In another approach to combining multiple serial links to improve bandwidth, an arrangement is provided that has multiple independent links that can access any bank from any link through the use of link switch logic placed between the link and bank controllers and the memory bank. An example of this is shown in FIG. 2. This example is the same as the FIG. 1 except for the inclusion of a link switch 34 between the link and bank controllers 16,18,20, and the memory banks 22,24, 26 and link switch 36 between the memory banks 22,24,26 and the serial outputs 28,30,32. The address information contained in each serial input in this case also includes a bank identifier to allow selecting the bank for a given command. Simultaneous access from the different links to the same bank is not allowed. The link switches prevent the contention of serial bit streams by allowing the first link at which serial data is being asserted for a given bank to have higher priority than a second link accessing the same bank. In order to deal with this contention prevention, the link switches 34,36 are not simple circuits that contain only a few logic switches. Once again, multiple circuits such as shown in FIG. 2 can be connected in sequence, and addressing on the serial interconnections is used to select a particular one of the multiple circuits.

Figure 3:
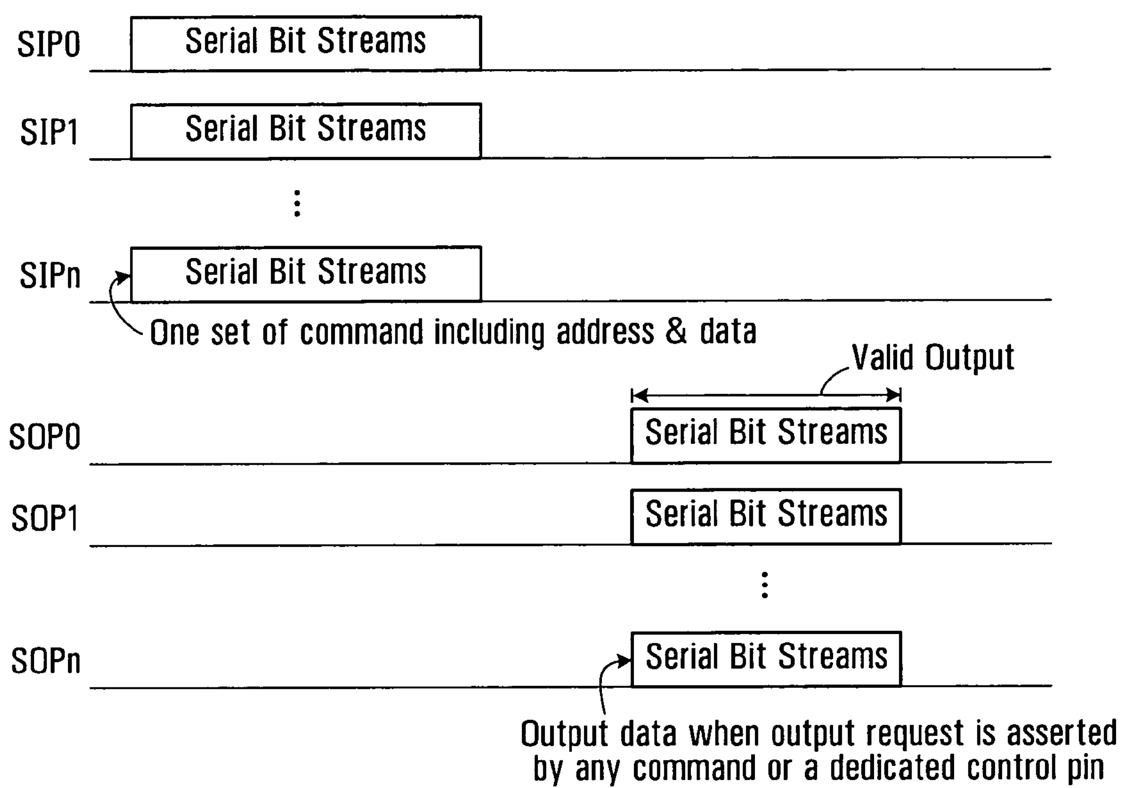
FIG. 3 is a timing diagram for serial operation of the memory system of FIG. 2.

FIG. 3 shows a simple example of a timing diagram with input and output serial ports which are defined in peripheral circuitry of memory devices that consists of multiple banks, corresponding with the example of FIG. 2. In FIG. 3, the ports that receive signals for serial inputs SI0 10, SI1 12, SIn 14 are indicated at SIP0, SIP1, SIPn. The ports that output serial outputs SO0 28, SO1 30, SOn 32 are indicated at SOP0, SOP1, SOPn. The number of link ports does not have to be the same as the number of banks incorporated in a memory device. Any numbers of bank and link combinations are allowed. With this flexibility of link and bank interconnection, data input and output paths can be easily transferred to the next device in the daisy chain fashion. All link and bank combinations have a common interface by which data is transferred to the next device with serial connections (data width is "one"). For SIP0, there is an input signal that includes command, address and data information and that is valid for some period of time. Some time later, the output on SOP0 is valid and contains output data when an output request is asserted by any command or by a dedicated control pin. A similar timing arrangement is present for the other serial inputs and outputs.

A serial interface offers many advantages over a parallel interface, especially in view of small interferences and coupling effects. However, the serial interface needs a higher frequency of operation compared to the parallel interface in order to keep the same amount of data bandwidth. In some frequency ranges, a dual-bit operation may be better than the multiple serial data bus interface.

Embodiments of the invention provide an interface that is configurable to operate as either a set of single bit serial interfaces or a multi-bit parallel interface. The multi-bit parallel interface may be a dual-bit parallel interface or a larger number of bits, depending on the maximum data output and depending on the available output ports. When the data output width is changed from the 1-bit serial configuration to multi-bit parallel configuration, one set of input controls (i.e. the inputs normally used to control a single bit serial interface) is used to control the parallel interface, while the input controls that are normally used to control the other single bit serial interfaces are ignored.

Figure 9:
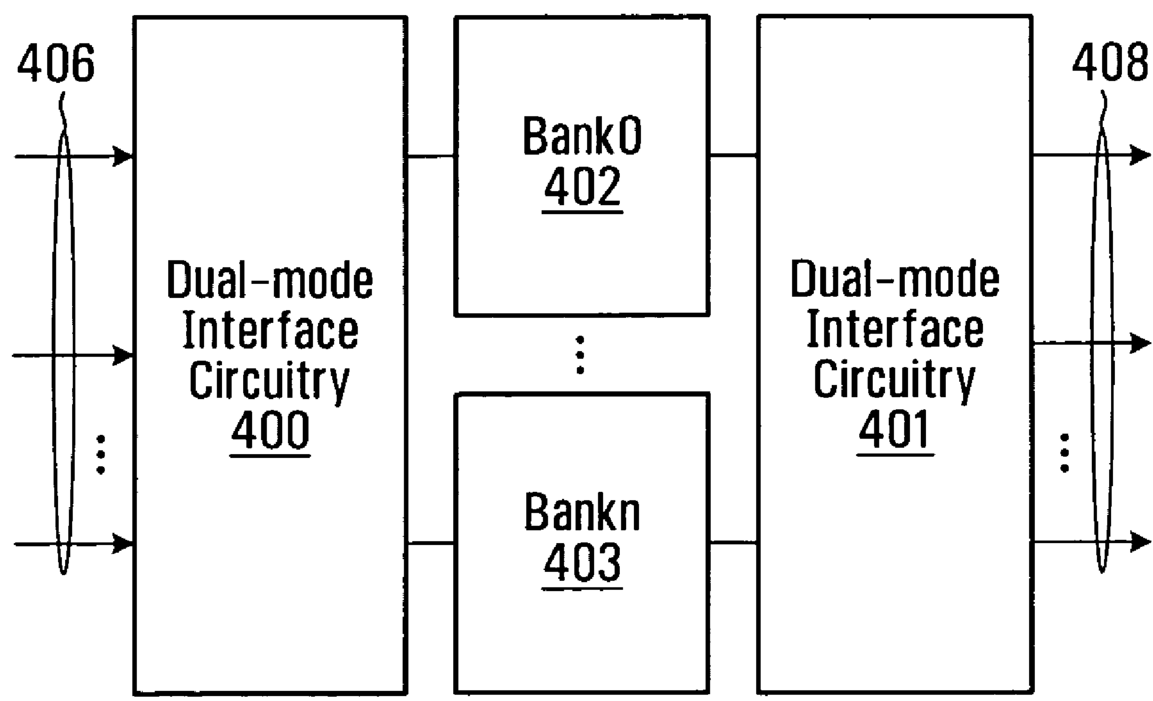
FIG. 9 is a block diagram of a dual-mode memory system provided by an embodiment of the invention.

Referring now to FIG. 9, shown is a block diagram of a dual-mode memory system provided by an embodiment of the invention. The system has dual-mode interface circuitry 400,401 connecting a set of inputs 406 and a set of outputs 408 to a set of memory banks 402 and 403. More generally, there is at least one memory bank. The interface circuitry 400 has a serial mode during which each input 406 operates as a respective serial input and each output 408 operates as a respective serial output. The interface circuitry 400 has a parallel mode during which the inputs 406 operate collectively as a parallel input and the outputs 408 operate collectively as a parallel output. More generally, during serial mode, at least one of the inputs and at least one of the outputs are operable in a serial mode. For example, a possible configuration like this is an 8-link, 10 bank configuration. During parallel mode, all 8 links are used in parallel to access the bank. During serial mode, one link is used to access the bank.

Figure 4:
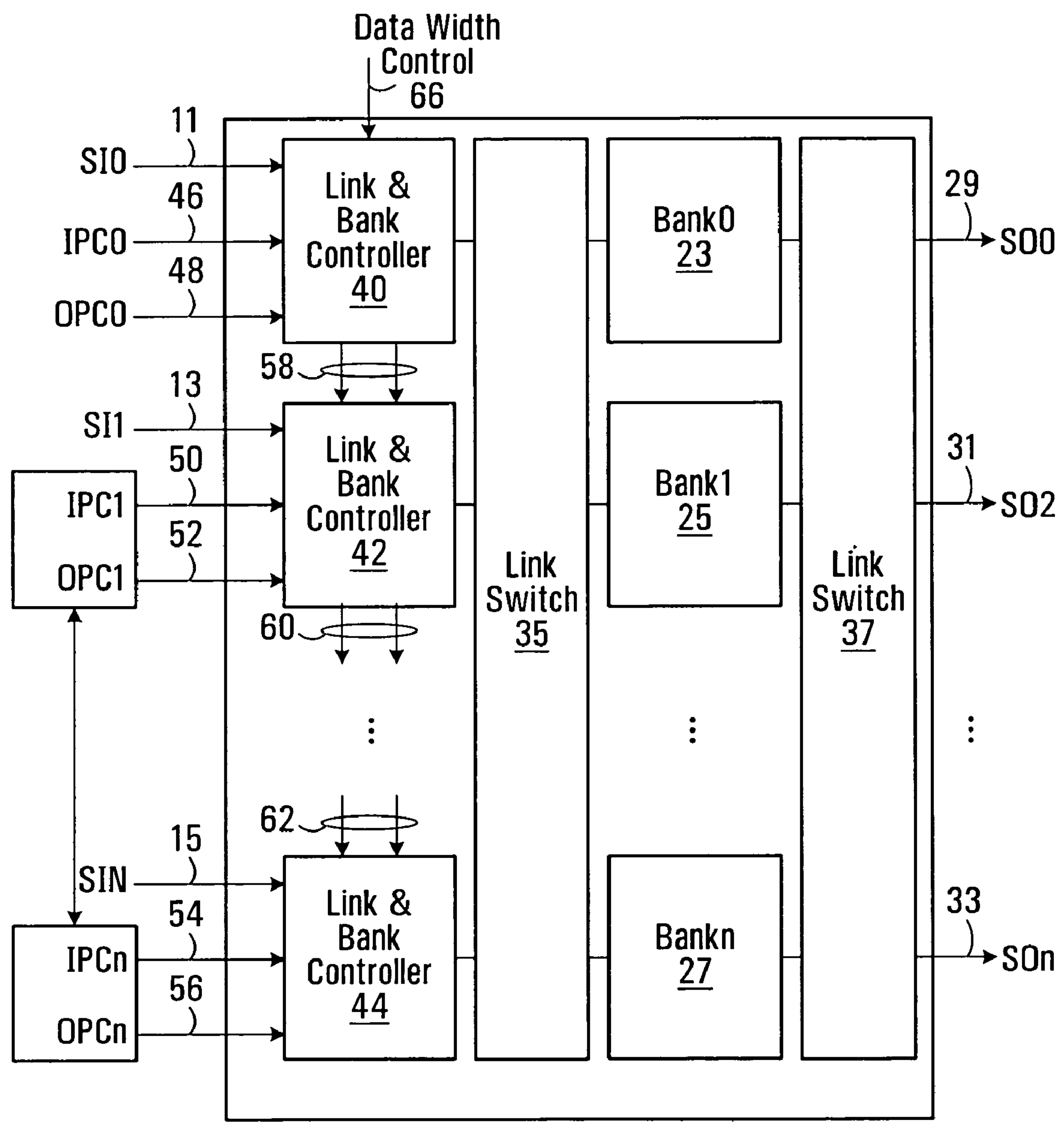
FIG. 4 is a block diagram of a memory system having a serial mode during which the system has single-bit serial interfaces and a parallel mode during which the system has a multi-bit parallel interface.

Detailed examples of the system of FIG. 9 will now be described with reference to FIGS. 4 to 8. Referring now to FIG. 4, shown is a block diagram of a memory system that is reconfigurable between serial and parallel operation. The example assumes n links and n banks, but the figure only includes details of the first, second and nth links and banks. The circuit has a set of n inputs, three of which are shown for now referred to as serial inputs SI0 11, SI1 13, SIn 15, a corresponding set of n link and bank controllers 40,42,44, a link switch 35, memory banks Bank0 23, Bank1 25, Bankn 27, link switch 37, and a set of outputs, for now referred to as serial outputs SO0 29, SO1 31, SOn 33. The link and bank controllers 40,42,44 interconnect the serial inputs 11,13,15 to the link switch 35. The link and bank controller 40 for SI0 11 has additional pins for IPC0 (input control 0) 46, OPC0 (output control 0) 48. The link and bank controller 42 for SI1 13 has additional pins for IPC1 50, OPC1 52. The link and bank controller 44 for SIn 15 has additional pins for IPCn 54, OPCn 56. There is also an input 66 to link and bank controller 40 for receiving a data width control input that controls a data width that the system operates at. In some embodiments, this is a single bit that selects between serial mode operation and parallel mode operation. In other embodiments, this is a plurality of bits for indicating the data width as any width between 1 and some predefined maximum data width. The data width control signal input to data width control input 66 of the link and bank controller 40 is similarly input to all of the other link and bank controllers, although this is not shown. In some embodiments, the data width control signal received on data width control input 66 comes from a configuration register that is set during a power-up sequence. It may, for example be a single bit. When this bit is '0', it means the system should operate in serial mode, otherwise the bit is "1", and the system should operate in parallel mode.

During parallel mode operation, there is a single command effecting all of the link and bank controllers 40,42,44, and a single memory bank is involved for read or write operation. The particular manner by which a command, containing command, address and possibly data, is received for parallel operation is implementation specific. In an example implementation, the bits of each field are received in parallel as part of the overall parallel input. Command and address bits can be fed to a single link and bank controller, for example link and bank controller 40, where command and address processing occurs. Alternatively, a dedicated command and address register might be provided for parallel operation.

During serial mode operation, control pins 46,48 are dedicated control pins for link and bank controller 40. In some implementations, IPC 46 has the function of gating the input streams so that this pin should be 'high' during command, addresses, and/or data assertion through SI. OPC is used to enable an output buffer. When OPC is high after a read command is issued, data is transmitted to an assigned location like another memory or a controller depending on connections.

The other control pins are similarly dedicated to a particular link and bank controller. Furthermore, while in serial mode, each link and bank control extracts its own command, address, data information from each serial input.

During parallel mode operation, parallel link operation is controlled using IPC0 and OPC0 in common. More specifically, all of the link and bank controllers 40,42,44 operate as a function of the input control and output control of the first link and bank controller 40. More generally, all of the link and bank controllers will operate as a function of the input control and the output control of a particular one of the link and bank controllers. Interconnections between adjacent pairs of link and bank controllers are shown, with the interconnections between link and bank controllers 40,42 indicated at 58, the interconnections between link and bank controllers 42 and a subsequent link and bank controller (not shown) indicated at 60, and interconnections between a second to last link and bank controller (not shown) and link and bank controller 44 indicated at 62. The purpose of these interconnections is to propagate the IPC0 and OPC0 controls 46,48 from the first link and bank controller 40 to all the other link and bank controllers 42,44 such that all of the link and bank controllers receive the same parallel link control signals during parallel operation. For the FIG. 4 embodiment, the link and bank controllers 40,42,44 collectively function as an example of dual-mode interface circuitry.

In order to control all links with IPC0 and OPC0 when parallel operation is selected, the other links (links 1 through n) are provided with internal circuitry to switch the control signal path from using the inputs on IPCx and OPCx, x=1, . . . , n for serial operation to using IPC0 and OPC0 for parallel operation. A detailed example of such internal circuitry will be described below with reference to FIGS. 8A and 8B. After parallel operation is enabled, only IPC0 and OPC0 are relevant, and other IPCx and OPCx do not have any functionality and external signal assertion does not affect any operations of the system.

Figure 5:
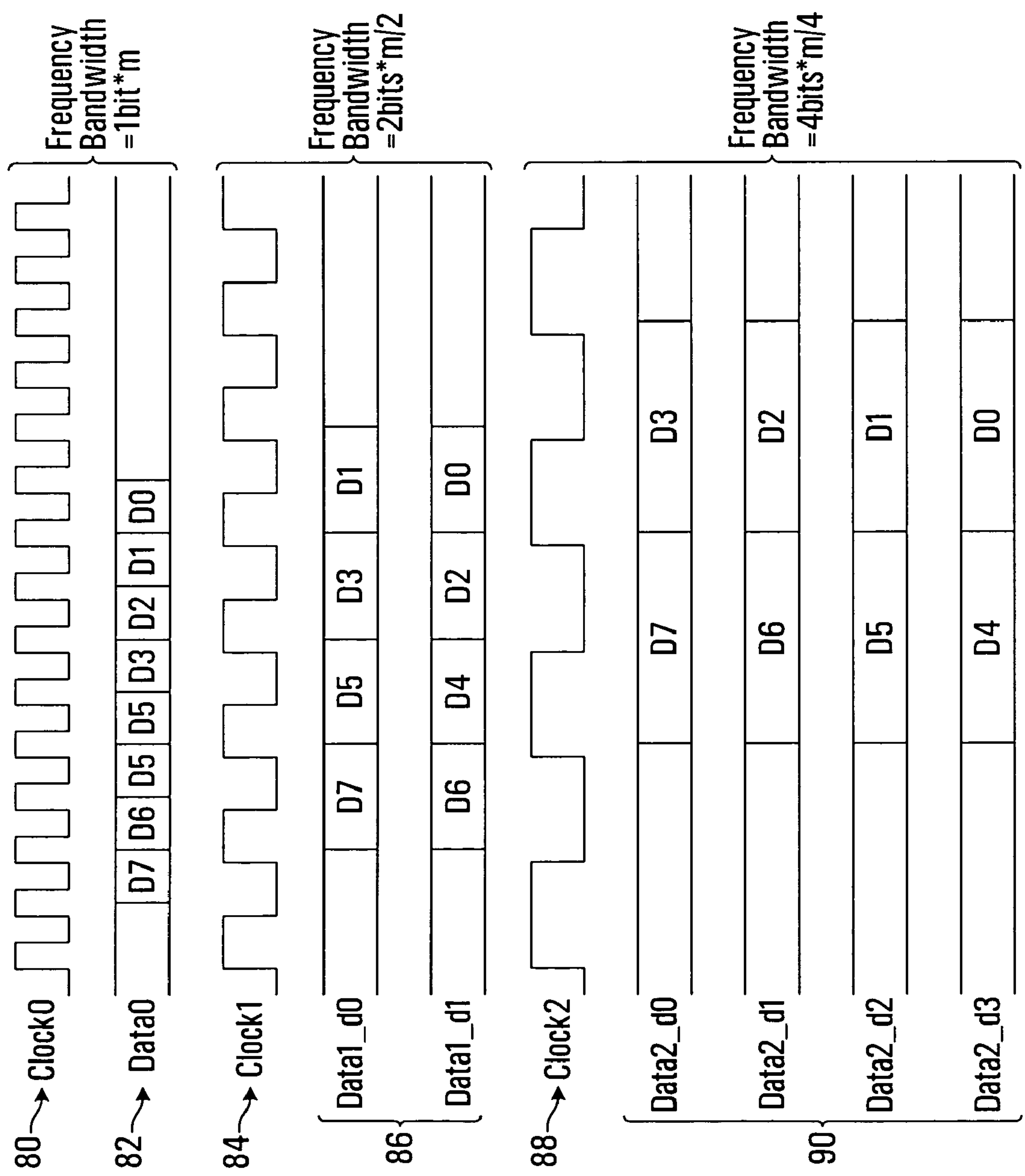
FIG. 5 is a diagram illustrating a bandwidth comparison among three data output configurations.

Bank access results when a read is asserted or when input data from multiple SIP ports is to be written have multiple data combinations as shown in FIG. 5. An example of serial operation and several examples of parallel operation will be described. A first clock 80 is shown for serial operation. For this clock the frequency is some value m, and the bandwidth is 1 bit*m. The data stream is indicated at 82. In case of one bit data width, i.e. serial operation, the following data is read/written, where the number represents the bit order, with '7' representing the MSB and '0' representing the LSB:

D7→D6→D6→D4→D3→D2→D0→D1 (SIP0 and SOP0).

A second clock 84 is shown for 2 bit parallel operation. This clock is assumed to have a clock frequency of m/2, and the bandwidth is 2 bits*m/2=m, the same as the serial example described above. The data stream is indicated at 86. In case of two bit data width parallel operation, the following data is read/written:

D7→D5→D3→D1 (SIP0 and SOP0)

D6→D4→D2→D0 (SIP1 and SOP1).

A third clock 88 is shown for 4 bit parallel operation. This clock is assumed to have a clock frequency of m/4, and the bandwidth is 4 bits*m/4=m, the same as the serial example described above. The data stream is indicated at 90. In case of four bit data width parallel operation, the following data is read/written:

D7→D3 (SIP0 and SOP0)

D6→D2 (SIP1 and SOP1)

D5→D1 (SIP2 and SOP2)

D4"D0 (SIP3 and SOP3)

For the examples of FIG. 5, the clock rates have been selected such that the data rate of the different operational modes is the same. This is intended to show that in order to get a certain bandwidth requiring a clock frequency m, the same bandwidth can be achieved with a single bit serial interface, with a dual bit parallel interface with a clock frequency m/2, or with a four bit parallel interface with a clock frequency of m/4. Of course, if the parallel interface is capable of operating at clock frequency m, then the dual bit parallel interface would have double the bandwidth of the single bit interface.

Figure 6:
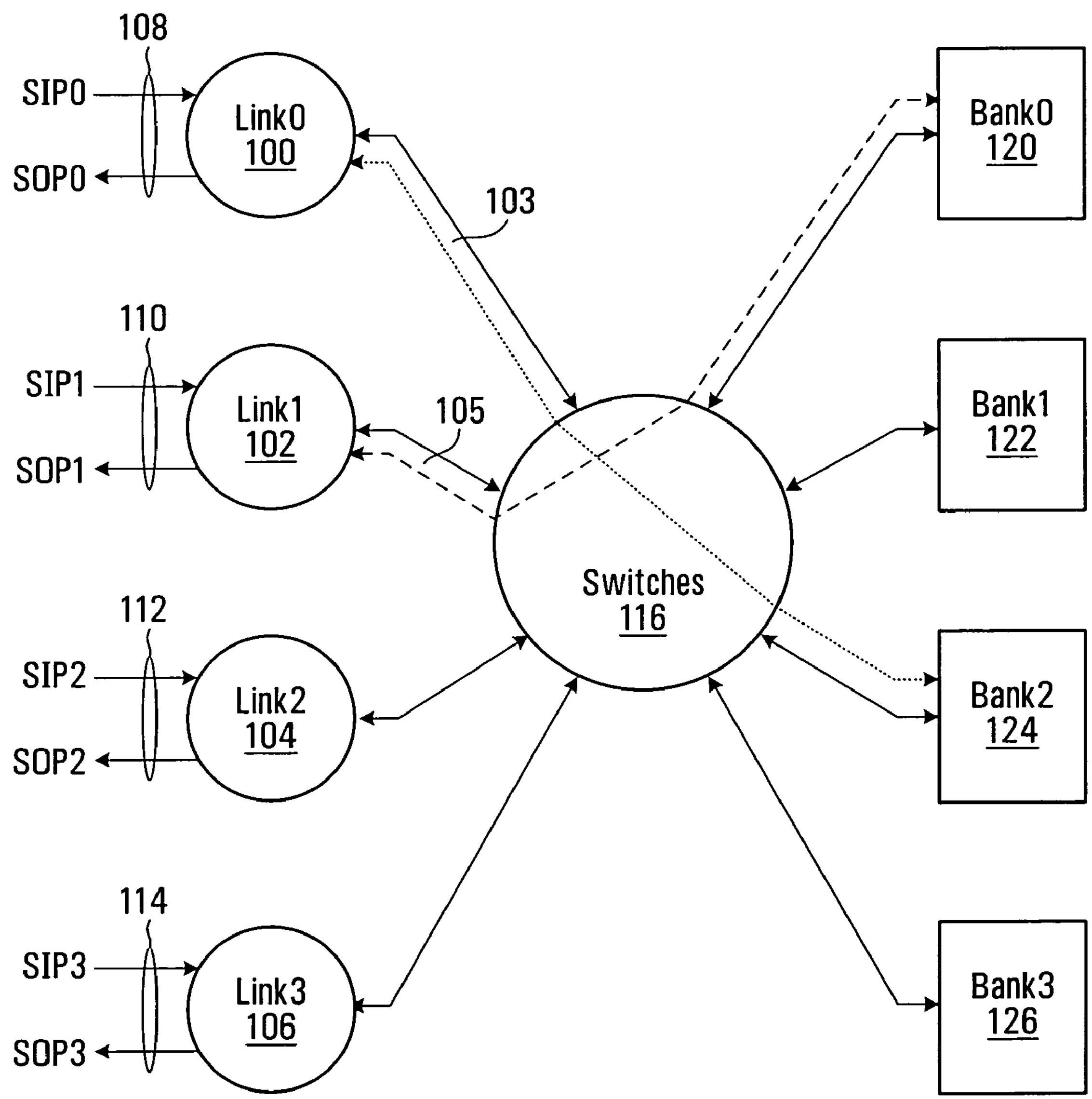
FIG. 6 is a block diagram showing a multiple independent serial link configuration with a 1-bit serial data process.

FIG. 6 shows an example of multiple links operating in serial mode. In this example, there are four independent links Link0, Link1, Link2, Link3 100,102,104,106 each with 1-bit data width, and four banks Bank0, Bank1, Bank2 Bank3 120,122,124,126, but more generally any number of links and banks can be employed. Unlike the previous figures where the circuitry for input and output operation has been shown separately, a "link" in FIG. 6 includes both input functionality and output functionality. Each link 100,102,104,106 has dedicated control pins (IPCx, OPCx, x=0, . . . , 3) (not shown, shown in FIG. 4). Link0 100 has I/O SIP0,SOP0 108, Link1 102 has I/O SIP1,SOP1 110, Link2 104 has I/O SIP2,SOP2 112 and Link3 106 has I/O SIP3,SOP3 114. The links 100, 102,104,106 are connected to the banks 120, 122, 124, and 126 through switches 116. Independently, each link 100,102, 104,106 can access a different bank 120,122,124,126 at the same time without any timing restriction. Paths 103,105 are examples of data stream paths illustrating data flow through a link and bank when 1-bit serial operation is used. Path 103 represents Link0 access to Bank2 while path 105 represents Link1 access to Bank0. More generally, flexible access from any link to any bank is provided for this example. The only restriction is that the same bank cannot be accessed by multiple different links simultaneously.

Figure 7:
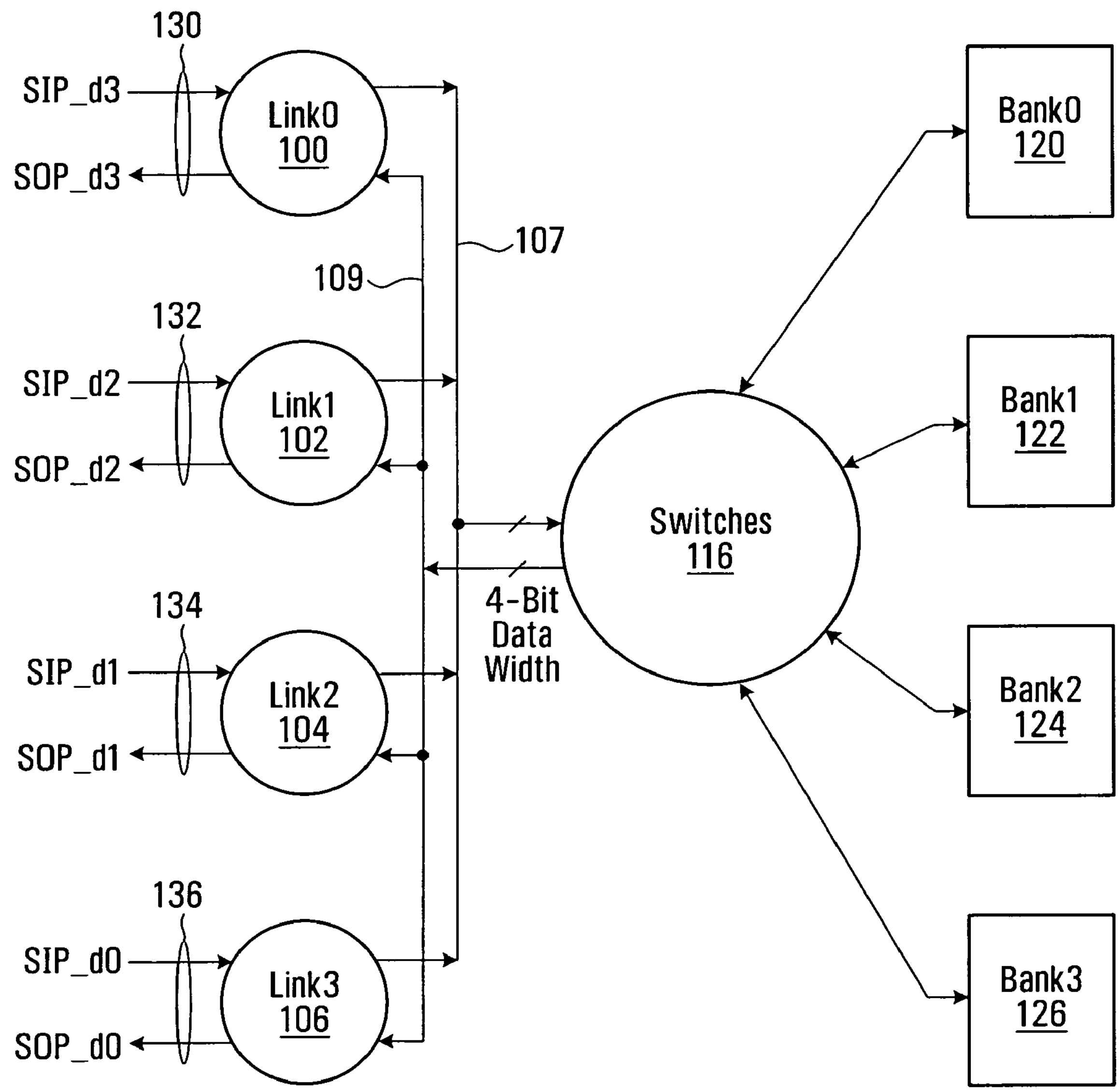
FIG. 7 is a block diagram showing a single dependent parallel link configuration with a 4-bit parallel data process.

FIG. 7 shows an example of the links of FIG. 6 operating in parallel mode. In this example, for write operations, there is a four-bit parallel input received over the four links 100,102, 104,106 for a selected one of the four banks 120,122,124,126. For read operations, there is a four-bit output from a selected one of the four banks 120,122,124,126 that is output in parallel from the four links 100,102,104,106. Control is through a single set of control pins (IPC0, OPC0) (not shown, shown in FIG. 4). The links 100,102,104,106, switches 116, and banks 120,122,124,126 are as shown in FIG. 6, but now the I/Os are labeled SIP_d3,SOP_d3 130 for Link0 100, SIP_d2, SOP_d2 132 for Link1 100, SIP_d1,SOP_d1 134 for Link2 104, SIP_d0,SOP_d0 136 for Link3 106. Physically, the input pins for parallel and serial operation are the same, but logically the input signals are different. Parallel operation writes to a selected bank or reads from a selected bank. Now, there is a 4-bit data width path 107 from the links 100,102,104,106 collectively for write and command, and 4-bit data width path 109 to the links 100,102,104,106 collectively for read operation. During a given parallel operation, a single one of the Banks 120,122,124,126 is selected. For parallel operation, only one bank can be accessed due to the single IPC and OPC (other IPC (1~n) and OPC (1~n) are not used).

It can be seen that the operational modes depicted in FIG. 6 and FIG. 7 employ different data widths. Using this approach, diverse data width control is possible and flexibility of data width size is available.

An example of circuits for interconnecting the dedicated serial link control inputs will now be described with reference to FIGS. 8A, 8B, 8C and 8D. These examples are specific to four link operation, but can be generalized to any number of links. A circuit 220 for multiplexing input control is shown in FIG. 8A, a circuit 240 for multiplexing output control is shown in FIG. 8B, a circuit 280 for producing serial or parallel outputs is shown in FIG. 8C, and a circuit 450 for processing serial and parallel inputs is shown in FIG. 8D.

Figure 8A:
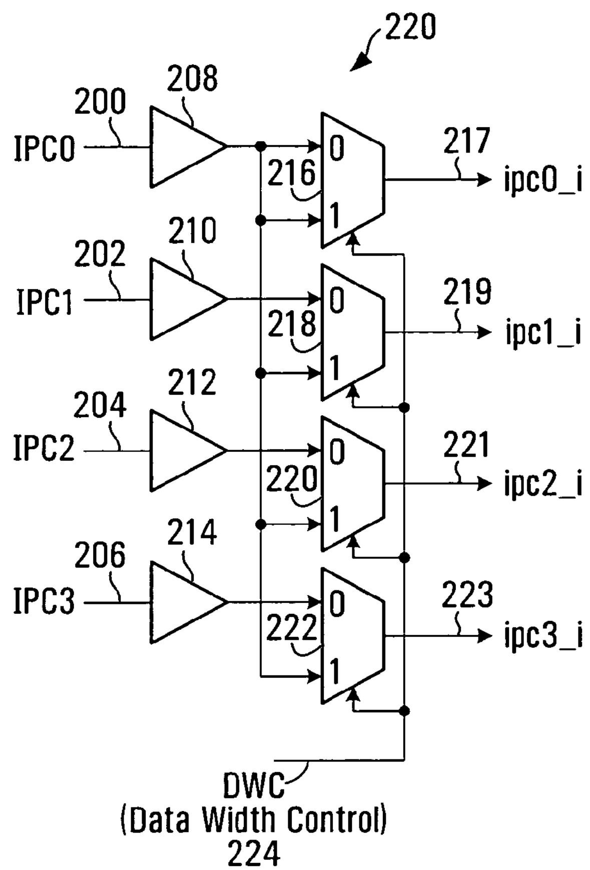
FIG. 8A is a schematic diagram of input control multiplexing.

Referring to FIG. 8A, the multiplexing for input control is generally indicated at 220. Four dedicated serial link input controls are indicated as IPC0 200, IPC1 202, IPC2 204 and IPC3 206. These are connected to respective buffers 208, 210,212,214, and then to a respective first input of each of four two-input multiplexers 216,218,220,222. In addition, the first serial link input control IPC0 200 is tied to the second input of each of the four two-input multiplexers 216,218,220, 222. The four two-input multiplexers 216,218,220,222 are controlled by the data width control signal 224. In this case, the control signal in a first state causes each of the individual serial link controls IPC0, IPC1, IPC2, IPC3 to appear at the outputs ipc0_i 217, ipc1_i 219, ipc2_i 221, ipc3_i 223 of the multiplexers 216,218,220,222, and in a second state causes IPC0 to appear at the outputs of all of the multiplexers.

Figure 8B:
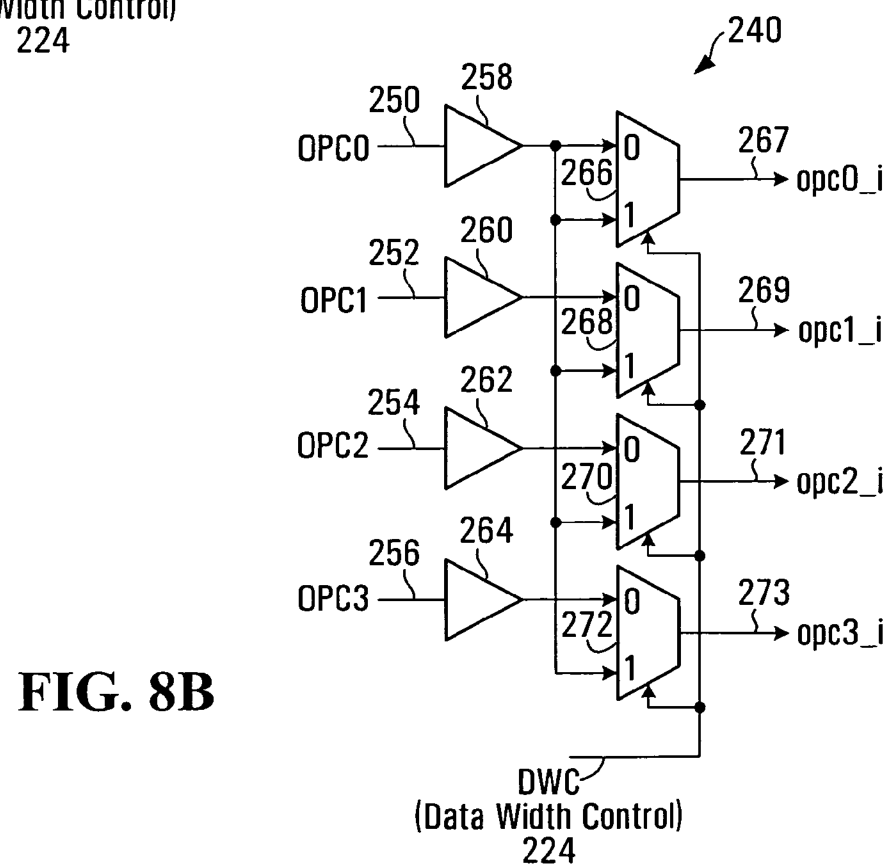
FIG. 8B is a schematic diagram of output control multiplexing.

Referring now to FIG. 8B, the multiplexing for output control is generally indicated at 240. The four dedicated serial link output controls are indicated as OPC0 250, OPC1 252, OPC2 254 and OPC3 256. These are connected to respective buffers 258,260,262,264, and then to a respective first input to each of four two-input multiplexers 266,268,270,272. In addition, the first serial link output control OPC0 250 is tied to the second input of each of the four two-input multiplexers 266,268,270,272. The four two-input multiplexers 266,268, 270,272 are controlled by the data width control signal 224. In this case, the control signal in a first state causes each of the individual serial link controls OPC0, OPC1, OPC2, OPC3 to appear at the outputs opc0_i 267, opc1_i 269, opc2_i 271, opc3_i 273 of the multiplexers 266,268,270,272, and in a second state causes OPC0 to appear at the outputs of all of the multiplexers.

Figure 8C:
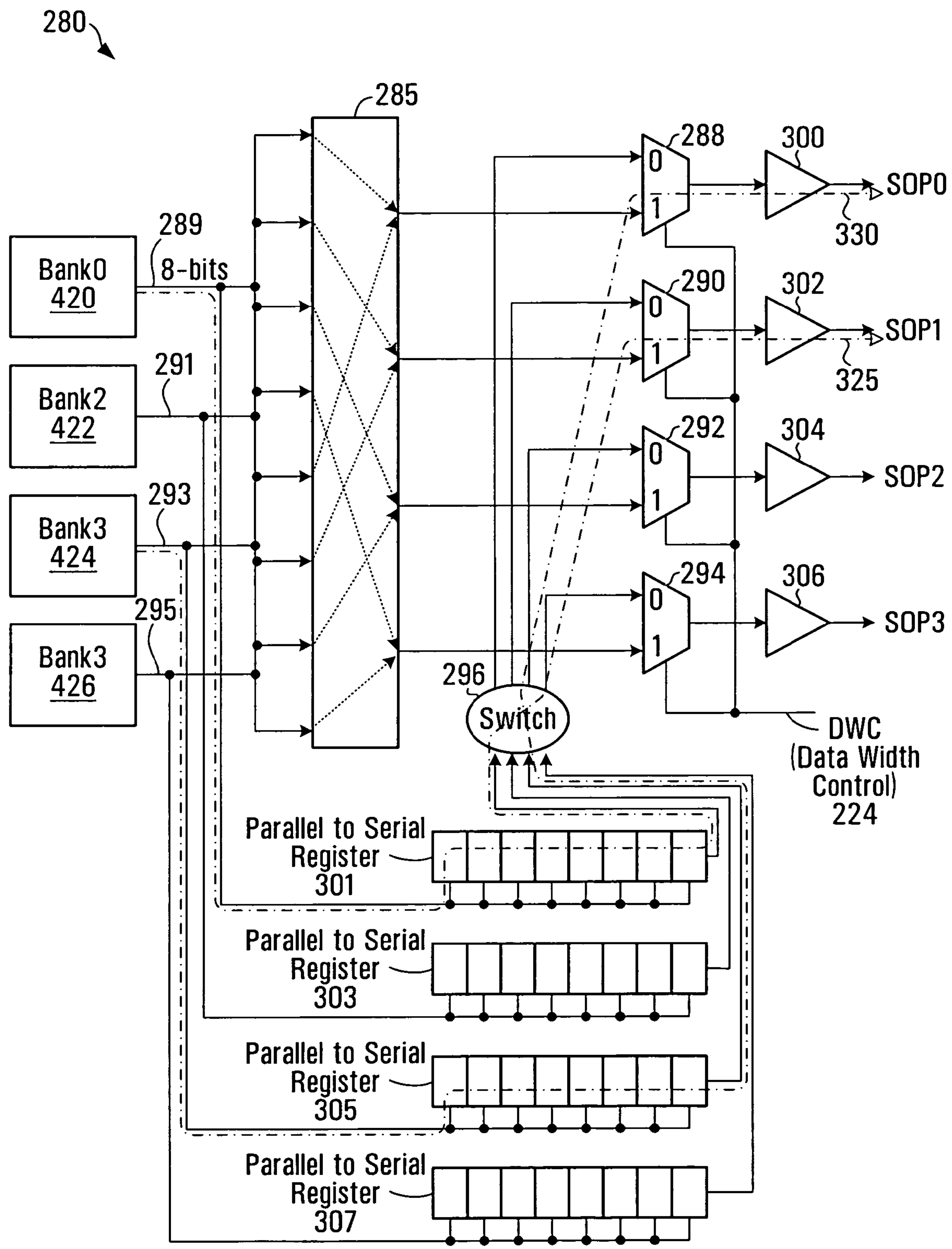
FIG. 8C is a schematic diagram of bank output switching for serial and parallel operation.
Figure 8D:
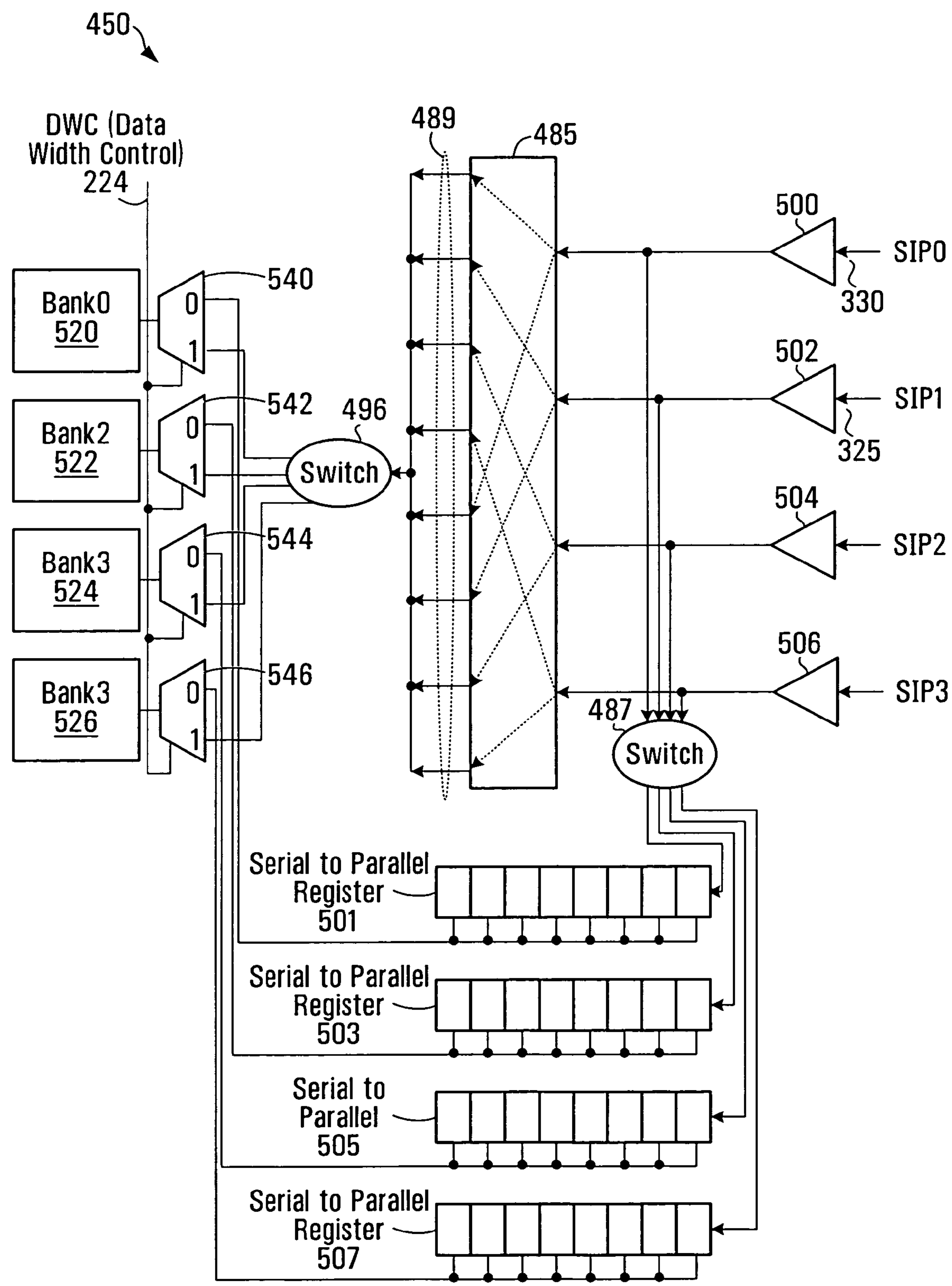
FIG. 8D is a schematic diagram of bank input switching for serial and parallel operation.

Referring now to FIG. 8C, generally indicated at 280 is a circuit that converts a parallel data output process to a serial data process with multiplexers. This example assumes that there are four outputs, labeled SOP0 300, SOP1 302, SOP2 304, and SOP3 306. Each of four banks Bank0 420, Bank0 422, Bank2 424 and Bank3 426 has a respective 8-bit parallel output 289,291,294,295 connected to the input of a data width converter 285. Note that for parallel operation, only one of the 8-bit parallel outputs 289,291,294,295 is active at a given time. Shown are four multiplexers 288,290,292,294 each having first (labeled "0") and second (labeled "1") inputs and a control input that is connected to receive the data width control signal 224. Each of the multiplexers 288,290,292,294 produces a respective output that passes through respective buffers 300,302,304,306 to produce the signals at the outputs. For each bank 420, 422, 424, 426 there is a respective parallel-to-serial register 301,303,305,307 the output of which is connected to a switch 296. The switch 296 selectably connects the output of each of the parallel-to-serial registers 301,303, 305,307 to a respective one of the first inputs of the multiplexers 288,290,292,294. Four outputs of the data width converter 285 are connected to the second inputs of the multiplexers 288,290,292,294.

During serial operation, the data width control signal 224 selects the first input to each of the multiplexers 288,290,292, 294. For each serial operation, data output by one of the banks 420,422,424,426 (up to four simultaneously) is moved to the corresponding parallel-to-serial register 301,303,305,307. The switch 296 controls which output that each serial output is to appear on by selecting to which first multiplexer input the 8-bit serial output of each parallel-to-serial register 301,303, 305,307 is to be routed under control of the input link number. For read operations, the serial output is produced at the same link through which the command was received. Thus, if the command was received at link 0 for example, the output should be transmitted to output link0 in order to prevent accidental data contention in the output stage. The switch 296 passes the serial outputs of the parallel to serial registers 301,303,305,307 to the selected first inputs. The multiplexers 288,290,292,294 pass these inputs through to the selected outputs. For the purpose of example, a data flow for serial link output from Bank0 to Link1 is shown at 325 (this corresponding with the flow 105 of FIG. 6), and a data flow for serial link output from Bank2 to Link0 is shown at 330 (this corresponding with the flow 103 of FIG. 6).

During parallel operation data width converter 285 receives 8 bits from a selected one of the banks 420,422,424, 426 and converts this to an output having a bitwidth of four, with two bits per output. For parallel operation, the data width control signal 224 selects the second input to each of the multipliers 288,290,292,294. The data width converter 285 routes the $0^{th}$ and $4^{th}$ bits to the second input of the first multiplexer 288, routes the $1^{st}$ and $5^{th}$ bits to the second multiplexer 290, routes the $2^{nd}$ and $6^{th}$ bits to the second input of the third multiplexer 292, and routes the $3^{rd}$ and $7^{th}$ bits to the second input of the fourth multiplexer 294. The multiplexers all select these second outputs and produce two bits at each output, and the overall parallel output signal has a bitwidth of four. In the described example, it is assumed that all of the serial links (four in the example) are combined into a single parallel link. In other implementations, a subset, for example two, of the serial links are combined into a parallel link. In this case the circuit would operate with a bitwidth of two. In that case, only two outputs SOP0 and SOP1 are available.

Referring now to FIG. 8D, generally indicated at 450 is a circuit that converts a serial data input process to a parallel data process. This example assumes that there are four inputs, labeled SIP0, SIP1, SIP2, and SIP3. Furthermore, for this example it is assumed that during parallel operation, the bitwidth is four. Four banks 520,522,524,526 are shown. Each of the banks 520,522,524,526 is connected to receive an input from a respective serial-to-parallel register 501,503,505,507.

Each of the inputs SIP0, SIP1, SIP2, and SIP3 passes through respective input signal buffers 500,502,504,506. The buffers 500,502,504,506 are connected to a data width converter 485. Data width converter 485 receives 2 bits from each of the four inputs SIP0, SIP1, SIP2, and SIP3 and converts these collectively to an 8-bit parallel output 489. Each input SIP0, SIP1, SIP2, and SIP3 is also shown connected through a switch 487 to a respective selected one of the serial to parallel registers 501,503,505,507. Switch 487 operates under control of IPCi, and a bank address. The 8-bit parallel output 489 of the data width converter 485 is also connected to an 8-bit parallel input of a switch 496. The switch 496 has four 8-bit parallel outputs that are each connected to a respective first 8-bit input of four multiplexers 540,542,544,546. The output of each of the serial to parallel registers 501,503, 505,507 is connected to a respective second 8-bit input of the four multiplexers 540,542,544,546. The multiplexers operate as a function of the data width control input 224 to pass either the first inputs or the second inputs as described below.

During serial operation, the data width control input 224 selects the second input of each of the multiplexers 540,542, 544,546, namely the inputs from the serial to parallel converters 501,503,505, 507. Serial data received from one of the inputs SIP0,SIP1,SIP2,SIP3 is routed to a selected one of the serial to parallel registers 501,503,505,507 by the switch 487 (up to four simultaneously) as a function of the IPC and bank address of incoming commands. The selected serial to parallel register then produces a parallel output that is written to the corresponding selected bank via the corresponding multiplexer.

During parallel operation, the data width control input 224 selects the first input of each multiplexers an eight bit input (received two bits at a time from the four inputs SIP0,SIP1, SIP2,SIP3) is output as 8 bits 489 in parallel from the data width converter 485. Switch 496 selects one of the banks 520,522,524,526, and the data is written to the selected bank via the corresponding multiplexer. The result is that eight bits consisting of two bits received at each of the inputs are written to a selected bank.

The embodiments of FIGS. 4 to 8 assume that each link is independently switchable to each bank. In some embodiments, each link has a fixed relationship with a particular bank. For example, for the FIG. 4 embodiment, each link and bank controller 40,42,44 would be connected to a predetermined one of the memory banks 23,25,27, and each memory bank is connected to a predetermined one of the outputs. This would mean that link switches 35,37 would not be required.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory system comprising:

at least one memory bank;

interface circuitry operable with a plurality of modes, for connecting a plurality of inputs and a plurality of outputs to the at least one memory bank, the interface circuitry having a serial mode during which each of at least one input of the plurality of inputs operates as a respective serial input and each of at least one output of the plurality of outputs operates as a respective serial output, the interface circuitry having a parallel mode during which the plurality of inputs operate collectively as a parallel input and the plurality of outputs operate collectively as a parallel output.

2. The memory system of claim 1 wherein the at least one memory bank comprises a plurality of memory banks.

3. The memory system of claim 2 wherein during serial mode, the at least one input that each operates as a respective serial input comprises a plurality of the inputs, and the at least one output that operates as a respective serial output comprises a plurality of the outputs.

4. The memory system of claim 3 wherein the interface circuitry comprises dual-mode interface circuitry comprising:

a plurality of link and bank controllers each having a respective input of the plurality of inputs;

wherein each of the plurality of link and bank controllers is operable in serial mode to perform read and write operations in a serial manner by processing for each read and write operation a single bitwidth input signal received on the respective input containing command, address and data if the operation is write operation;

wherein the plurality of link and bank controllers are operable collectively in parallel mode to perform read and write operations in parallel by processing for each read and write operation a multiple bitwidth input signal received on multiple inputs containing command, address and data if the operation is a write operation.

5. The memory system of claim 4 wherein each link and bank controller is connected to a predetermined one of the memory banks and each memory bank is connected to a predetermined one of the outputs.

6. The memory system of claim 4 wherein:

each link and bank controller further comprises a respective input control for write operations and a respective output control for read operations;

the dual mode interface circuitry is operable during parallel mode to connect the input control of a common one of the plurality of link and bank control circuits to the input control of the remaining link and bank control circuits and to connect the output control of the common of the plurality of link and bank control circuits to the output control of the remaining link and bank circuits such that during parallel mode all of the link and bank control circuits operate in common;

the dual mode interface circuitry is operable during the serial mode to allow independent signals to be received at each input control and output control.

7. The memory system of claim 4 wherein the plurality of link and bank controllers comprise a respective link and bank controller for each memory bank.

8. The memory system of claim 4 further comprising:

at least one link switch that operates during serial mode to connect each link and bank controller to a respective selected bank and that operates during parallel mode to connect all of the link and bank controllers to a selected memory bank.

9. The memory system of claim 8 wherein:

the at least one link switch comprises a first link switch that connects each link to a respective selected bank for write and control, and a second link switch that connects each link to the selected bank for read, preventing simultaneous connection of multiple links to the same bank.

10. The memory system of claim 1 wherein the dual mode interface circuitry comprises:

an input receiving a data width control input that selects between serial mode and parallel mode.

11. The memory system of claim 4 wherein the dual mode interface circuit comprises:

an input for receiving a data width control input signal that selects between serial mode and parallel mode;

for each link and bank controller a respective first multiplexer having first and second inputs, each first input connected to the respective input control of the link and bank controller, each second input connected to the input control of a common one of the link and bank controllers, the first multiplexer operable to select the first input or the second input under control of the data control width control input;

for each link and bank controller, a respective second multiplexer having first and second inputs, each first input connected to the respective output control of the link and bank controller, each second input connected to the output control of the common one of the link and bank controllers, the second multiplexer operable to select the first input or the second input under control of the data control width control input signal.

12. The memory system of claim 1 wherein the interface circuitry comprises dual mode interface circuitry comprising:

for each memory bank, a respective parallel to serial converter having a serial output;

switching logic that switches the serial output of each parallel to serial converter towards a selected output.

13. The memory system of claim 12 further comprising:

selector logic for selecting serial outputs of the parallel to serial converters during serial mode, and for selecting a parallel output during parallel mode.

14. The memory system of claim 13 further comprising:

a data width converter that produces said parallel output by convening an output from a selected bank from a data width for bank access to a data width equal to the number of outputs of said plurality outputs.

15. The memory system of claim 1 wherein the interface circuitry comprises dual mode interface circuitry comprising:

for each memory bank, a respective serial to parallel to converter;

switching logic that switches each input to the input a respective selected one of the parallel to serial converters.

16. The memory system of claim 15 further comprising:

a data width converter that converts a parallel input having a data width equal to the number of inputs of said plurality of inputs to a data width for bank access.

17. A method comprising:

reconfiguring a memory interface into a selected one of a serial mode and a parallel mode according to a data width control input;

in serial mode, the memory interface functioning as at least one serial interface;

in parallel mode, the memory interface functioning as a parallel interface.

18. The method of claim 17 further comprising:

during serial mode, providing serial access from each link to any bank of a plurality of banks.

19. The method of claim 17 wherein reconfiguring a memory interface into a selected one of a serial mode and a parallel mode according to a data width control input comprises:

for serial mode, reconfiguring a plurality of link and bank controllers such that during serial mode, independent input and output controls are received for each of at the at least one serial interface;

for parallel mode, reconfiguring the plurality of link and bank controllers such that an input and output control received at one link and bank controller is used in common by all of the link and bank controllers.

* * * * *

UNITED STATES PATENT AND TRADEMARK OFFICE

CERTIFICATE OF CORRECTION

PATENT NO. : 7,529,149 B2
APPLICATION NO. : 11/637175
DATED : May 5, 2009
INVENTOR(S) : Hong Beom Pyeon et al.

It is certified that error appears in the above-identified patent and that said Letters Patent is hereby corrected as shown below:

Column 7, line 67, "...D4"D0 (SIP3) and (SOP3)..." should be --...D4→D0 (SIP3 and SOP3)...--.

Signed and Sealed this

Tenth Day of November, 2009

David J. Kappos
*Director of the United States Patent and Trademark Office*